United States Patent [19]
Shirai

[11] 4,399,451
[45] Aug. 16, 1983

[54] SEMICONDUCTOR DEVICE AND METHOD FOR PRODUCTION THEREOF

[75] Inventor: Kazunari Shirai, Yokohama, Japan

[73] Assignee: Fujitsu Limited, Kanagawa, Japan

[21] Appl. No.: 221,371

[22] Filed: Dec. 30, 1980

[51] Int. Cl.³ .................. H01L 29/04; H01L 27/02
[52] U.S. Cl. .................................. 357/59; 357/41; 357/51
[58] Field of Search .................. 357/59, 51, 41

[56] References Cited

U.S. PATENT DOCUMENTS

| | | | |
|---|---|---|---|
| 4,143,178 | 3/1979 | Harada | 427/85 |
| 4,234,889 | 11/1980 | Raymond | 357/71 |
| 4,295,897 | 10/1981 | Tubbs | 357/59 X |
| 4,297,721 | 10/1981 | McKenny | 357/59 |
| 4,305,200 | 12/1981 | Fu et al. | 357/59 X |
| 4,319,260 | 4/1982 | Tasch, Jr. | 357/23 |
| 4,322,736 | 3/1982 | Sasaki et al. | 357/59 X |
| 4,326,213 | 4/1982 | Shirai | 357/59 |
| 4,336,647 | 6/1982 | McElroy | 29/571 |

FOREIGN PATENT DOCUMENTS 53-109487 9/1978 Japan.

Primary Examiner—Martin H. Edlow
Attorney, Agent, or Firm—Staas & Halsey

[57] ABSTRACT

A plural layered wiring which comprises a plurality of polycrystal semiconductor layers can be improved in its magnitude of circuit integration, when one or more upper polycrystal semiconductor layers which is or are doped to a moderate impurity concentration is or are utilized as resistor elements, the lowest polycrystal semiconductor layer which is highly doped is utilized for electrodes and/or wirings for active elements, and both polycrystal layers are connected with each other by regions which are highly doped by upward diffusion of impurities contained in highly doped regions of a substrate, because this configuration entirely avoids the restriction that is imposed for the location of resistor elements arranged in the upper layers. This arrangement is realized by a specific sequential combination of steps which includes a step of upward diffusion of impurities from the highly doped regions of the substrate. An additional advantage of this method is the exclusion of a so-called non-butting process.

7 Claims, 9 Drawing Figures

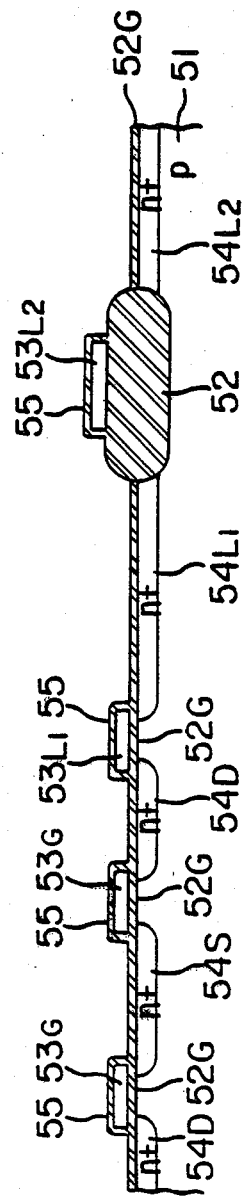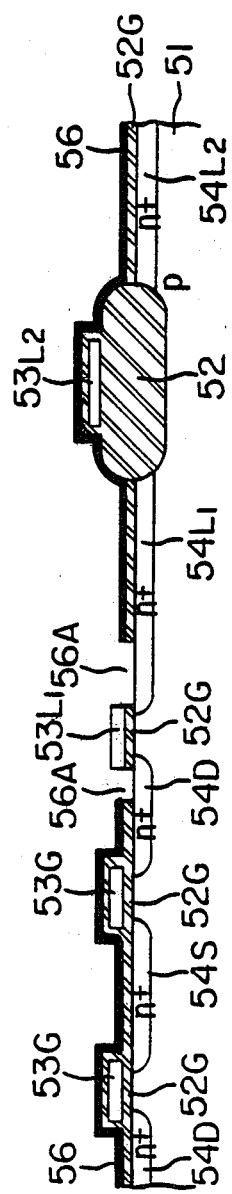

SEMICONDUCTOR DEVICE AND METHOD FOR PRODUCTION THEREOF

BACKGROUND OF THE INVENTION

This invention relates to semiconductor devices having one or more resistor elements produced with one or more polycrystal semiconductor layers and to methods for production thereof.

Static random access memory devices having 6-element cells can be classified into a group which utilizes one or more depletion transistors as one or more resistor elements and another group which has one or more resistor elements produced with one or more high resistance polycrystal semiconductor layers. Albeit the former is easy to produce, it involves the disadvantage of a lesser integration. Therefore, it is observed that the latter group is more frequently employed.

Static random access memory devices which have one or more resistor elements produced with one or more high resistance polycrystal semiconductor layers are further classified into two groups. One has a single layer and the other has plural layers. The latter is of course advantageous from the viewpoint of integration.

A prior invention by the same inventor was devices in which power supply ($V_{DD}$) lines and registor elements are produced from the first or lower polycrystal semiconductor layer, and wirings for various purposes including those for connection of transistors are produced with the upper polycrystal semiconductor layers. This prior art subject matter is for instance discussed in prior U.S. Pat. 4,326,213 issued Apr. 20, 1982.

Description of the subject matter of this prior art is now summarized below, referring to FIGS. 1 through 4, which respectively show a wiring diagram of a static random access memory cell, a schematic plan view of a major portion of a static random access memory device, a cross-sectional view of this plan view taken along the line A—A' and a cross-sectional view along the line B—B'.

The memory cell 10 includes transistors $Q_1$, $Q_2$, $Q_3$, and $Q_4$, load resistor $R_1$ and $R_2$, a power supply line $V_{DD}$, the bit lines 11, 12, a word line 13, a field numerals (20) 20, (21) respectively depict a field oxide layer 21 and a portion of a first or lower polycrystal semiconductor layer which constitutes the power supply line $V_{DD}$, various portions 21a to 21d of the first or lower polycrystal semiconductor layer which respectively constitute different wirings, windows or openings 22, 23, portions 24, 25 of a second polycrystal semiconductor layer which constitute independent wirings, a source region 26 provided commonly for both the transistors $Q_1$ and $Q_2$, a window or an opening 27 for contacting an electrode, a drain region 28 and the edge 29 of the drain region, a window, or an opening 30, a silicon gate 31 of the transistor $Q_1$, a silicon gate 32 of the transistor $Q_2$, a drain region 33 provided commonly for both the transistors $Q_2$ and $Q_4$, a source region 34 of the transistor $Q_4$, a contact window 35, a source region 36 of the transistor $Q_3$, a contact window 37, a drain region 38 of the transistor $Q_3$, a phosphosilicate glass film 39 and an oxide film 40.

In the above described arrangement, a plurality of polycrystal semiconductor layers is employed. In this sense, the degree of integration is improved to a considerable extent. It is noted, however, that the plural layer configuration is not applied to the high resistance polycrystal conductive layers. In other words, the plural layer configuration is not applied to the memory cell region and the application of the plural layer configuration for the polycrystal semiconductor layers is limited to the field region. In this sense, the present invention provides further improvement.

SUMMARY OF THE INVENTION

An object of this invention is to provide a highly integrated semiconductor device which is realized by the employment of a plural polycrystal conductive layer configuration.

Another object of this invention is to provide a method for production of a highly integrated semiconductor device which is realized by the employment of a plural polycrystal conductive layer configuration.

A further object of this invention is to provide a method for production of a highly integrated semiconductor device without employing a so-called non-butting process.

To attain the first of the above mentioned objects, a highly integrated semiconductor device is provided with (a) a highly doped and partly perforated first polycrystal semiconductor layer grown on a first insulator layer and which is utilized for production of electrodes and/or wirings for the elements produced in the substrate in which highly doped regions are located to constitute various elements therein, (b) a partly perforated second insulator layer produced on the first polycrystal semiconductor layer, (c) a patterned second polycrystal semiconductor layer grown in the second insulator layer, which is relatively less doped except for the regions to be contacted with the first polycrystal semiconductor layer or the substrate, which regions are highly doped due to the upward diffusion of impurities from the first polycrystal silicon layer or the highly doped region of the substrate.

To attain the second and third of the above mentioned objects, a method for production of a highly integrated semiconductor device which is realized by employment of a plural polycrystal conductive layer configuration comprises as a first step (a) to the growing of a doped or undoped first polycrystal semiconductor layer on a first insulator layer grown on a semiconductor substrate. This layer can be either doped or undoped at this stage depending on the specific required arrangement of elements and the process steps. This is followed by a step (b) pattern the first polycrystal semiconductor layer for production of electrodes and/or wirings for the active elements produced in the substrate, and a step (c) to selectively introduce impurities into the substrate and, if required, into the first polycrystal semiconductor layer. An ion implantation process is preferable for this step (c) for an accurate doping control, but an ordinary diffusion process is also available. The first polycrystal layer, if doped, may be undoped in this step. In other words, the process is aimed at the doping of either the substrate or the first polycrystal semiconductor layer or both the substrate and the first polycrystal semiconductor layer. In any case, the portion of the substrate uncovered by the first polycrystal layer must ultimately be doped in this step to form source and drain regions. A thick field oxide film, as well as the first polycrystal layer, functions as a mask to define these source and drain regions. Namely, when the first polycrystal semiconductor layer has been doped, this step is merely to introduce impurities into the substrate, and when the first polycrystal semiconductor layer has not been doped, this step is to introduce impurities into both the substrate and the first polycrystal semiconductor layer. This is followed by a step (d) to grow a second insulator layer on the first polycrystal semiconductor layer which has been highly doped in a preceding step, and a step (e) to perforate openings in the second insulator layer to reach the first polycrystal semiconductor layer or the substrate depending on the specific required arrangement of elements, a step (f) to grow a relatively less doped second polycrystal semiconductor layer on the second insulator layer, and a step (g) to upwardly diffuse impurities through the openings from the first polycrystal semiconductor layer and/or the substrate.

BRIEF DESRIPTION OF THE DRAWINGS

The present invention, together with its various features and advantages, can be readily understood from the following more detailed description taken in conjunction with the following drawings, in which:

FIG. 1 shows a wiring diagram of a static random access memory cell avairable in the prior art, FIG. 2 shows a schematic plan view of the major portion of a static random access memory device of the prior art, FIG. 3 shows a cross-sectional view of FIG. 2 taken along the line A—A', FIG. 4 shows a cross-sectional view of FIG. 2 taken along the line B—B', FIG. 5 shows a cross-sectional view, taken along the line A—A' shown in FIG. 9, of the major portion of a static random access memory device in accordance with an embodiment of the present invention, showing the position after the twelfth step for its production has been completed, FIG. 6 shows a figure corresponding to FIG. 5, after the fourteenth step for the production of the device, FIG. 7 shows a figure corresponding to FIG. 5, after the nineteenth step of its production, FIG. 8 shows a figure corresponding to FIG. 5, after the twenty third step of its production, and FIG. 9 shows a schematic plan view of the major portion of a static random access memory device in accordance with an embodiment of the present invention.

DETAILED DESCRIPTION OF THE PREFERRED EMBODIMENTS

Figure 1:
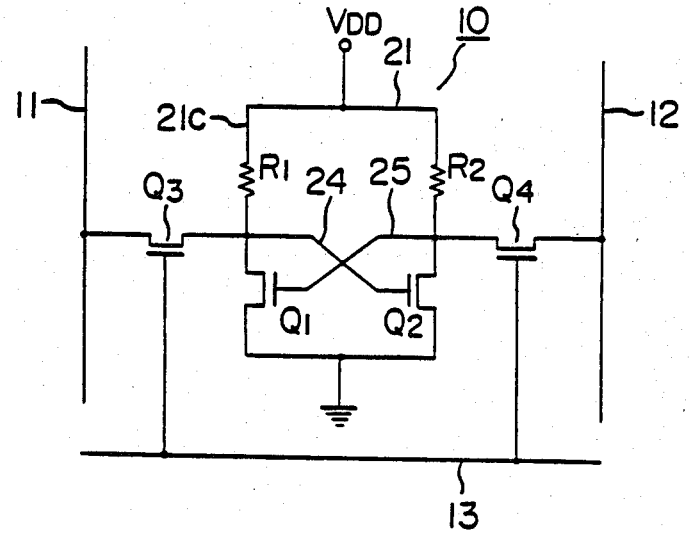
Figure 2:
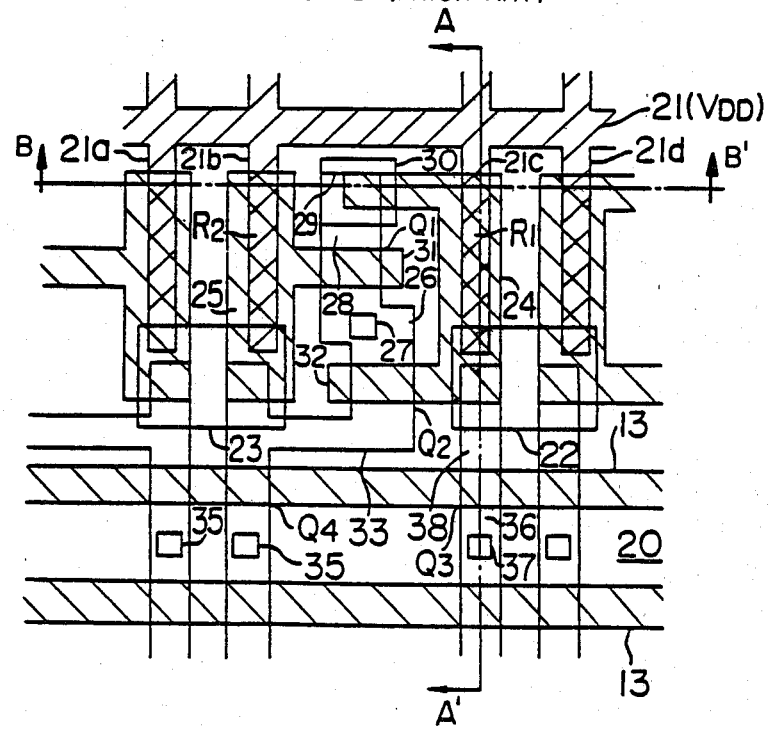
Figure 3:
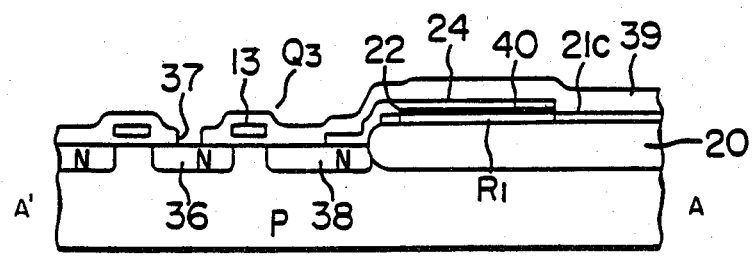
Figure 4:
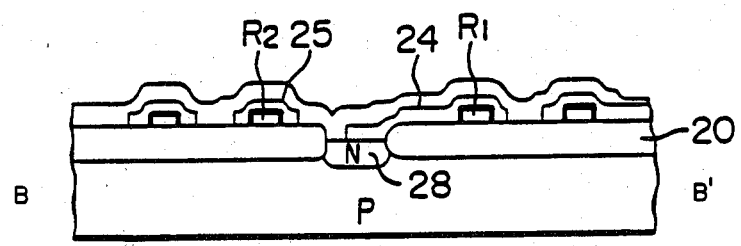

With reference respectively to FIGS. 5 through 8 and FIG. 9, the steps for production of and the arrangement and configuration of a highly integrated semiconductor device in accordance with this invention will be described below, assuming the semiconductor device is produced on a p-type silicon substrate.

Referring to FIG. 5, a silicon dioxide film with a thickness of, for example, 500 angstroms is grown on a p-type silicon substrate 51 with the crystal index 100 employing a thermal oxidation process. The purpose of this process is to produce a sublayer for a silicon nitride mask which will be employed as a mask for a selective thermal oxidation process scheduled to be carried out later. The second step is to employ a chemical vapor deposition process to grow a silicon nitride film with the thickness of, for example, 1,000 angstroms. The third step is to employ a lithography process for patterning the silicon nitride film. The fourth step is to employ an ion implantation process to introduce boron ions in to the wafer for production of a channel cut region (not shown). The energy level employed is approximately 50 KeV. The impurity concentration is preferably approximately $10^{13}/cm^2$. The fifth step is to employ a thermal oxidation process for growing a field silicon oxide layer 52 with a thickness of, for example, 8,000 angstroms. The sixth step is to remove the silicon nitride film which was employed as a mask during the fifth step and the silicon dioxide sublayer. As a result, the surface of the substrate 51 is uncovered except on the field silicon dioxide layer 52. The seventh step is to grow a new gate oxide film 52G with an excellent quality and with a thickness of, for example, 500 angstroms by a thermal oxidation process. The eighth step is to employ a chemical vapor deposition process for growing a first polycrystal silicon layer with the thickness of, for example, 4,000 angstroms. The ninth step is to selectively etch the first polycrystal silicon layer for production of various elements, such as silicon gates or word lines 53G, wirings 53L, and $53L_2$, etc. The tenth step is to apply a patterning process to the gate oxide film 52G. The eleventh step is to employ an ion implantation process to introduce arsenic ions in to selected portions of the wafer where the substrate is uncovered by either the field oxide layer 52 or the first polycrystal silicon layer for production of n-doped regions including source regions 54S, drain regions 54D, wiring regions 54L, and $54L_2$ etc. The twelfth step is to employ a thermal oxidation process to produce an oxide film 55 on the entire surface of the wafer.

Referring to FIG. 6, the thirteenth step is to employ a chemical vapor deposition process for growing a silicon nitride layer 56 with a thickness of, for example, 700 angstroms on the entire surface of the wafer, the fourteenth step is to employ a lithography process to selectively remove the silicon nitride layer 56 and the silicon oxide layers 55 and 52G for production of contact holes 56A.

Figure 7:
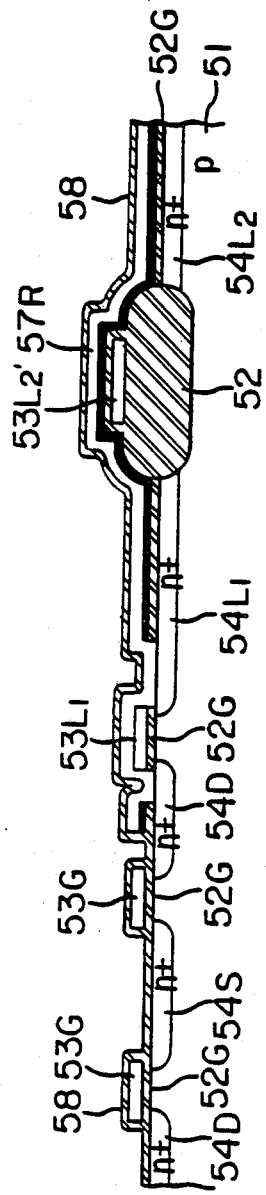

Referring to FIG. 7, the fifteenth step is to employ a chemical vapor deposition process for growing a second polycrystal silicon layer with a thickness of, for example, 4,000 angstroms on the entire surface of the wafer. Since this polycrystal silicon layer is utilized predominantly as resistor elements, the layer is undoped or lightly doped when grown, and is partly doped later to a required impurity concentration by a specific as described below. This doping process is one of the features of this invention. Namely, since the top surface portions of the substrate with which the second polycrystal silicon layer directly contacts are limited to the highly doped regions such as wiring regions $54L_1$, $54L_2$ and source and drain regions 54S, 54D, the dopant contained in the substrate diffuses upward during a heating process that is carried out later. As a result, the second polycrystal silicon layer is selectively doped at such limited locations as to allow ohmic contacts between the substrate and the second polycrystal silicon layer at the specific portions, such as wiring regions $53L_1$, drain regions 54D and wiring region $54L_1$. The sixteenth step is to employ an ion implantation process to introduce phosphorus ions to the entire part of the second polycrystal silicon layer without any masking step. The purpose of this process is to adjust the resistivity of the layer for use as the resistor elements. Therefore, an energy level employed is for example 50 KeV, and a preferable impurity concentration is for example $10^{13}/cm^2$. This process supplements the above described upward diffusion doping process. The seventeenth step is to employ a lithography process for patterning the second polycrystal silicon layer. The purpose of this process is to fabricate the resistor elements 574 etc. The eighteenth step is to employ an etching process to remove the silicon nitride film 56 and a portion of the silicon oxide films 55 and 52G. This etching process is carried out in succession to the above lithography process. The nineteenth step is to grow a silicon oxide film 58 having a thickness of, for example, 1,000 angstroms.

Figure 8:
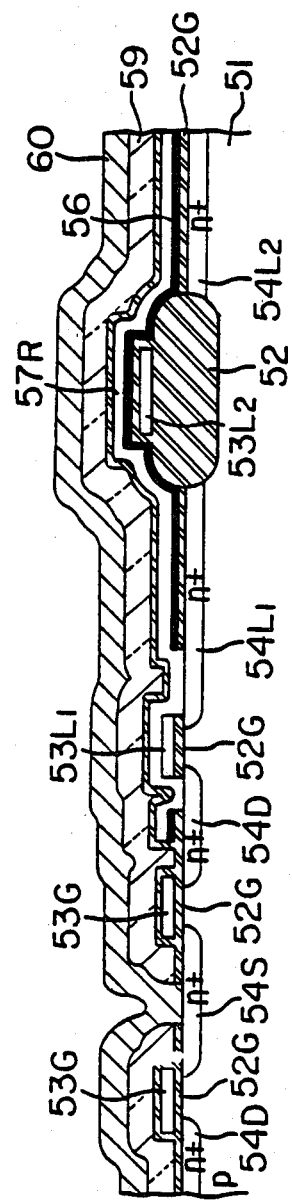

Referring to FIG. 8, the twentieth step is to employ a chemical vapor deposition process for growing a phospho-silicate glass film 59 having a thickness of, for example, 1 $\mu$m. The twenty first step is to employ a lithograph process for patterning the phospho-silicate glass film 59. The purpose of this process is to perforate contact holes for electrodes. The twenty second process is to employ an evaporation process for placing an aluminum film having the thickness of, for example, 1 $\mu$m. The twenty third step is to employ a lithography process for patterning the aluminum film. The purpose of this process is to fabricate electrodes and/or wirings 60 which constitutes bit lines and power supply lines etc.

Figure 9:
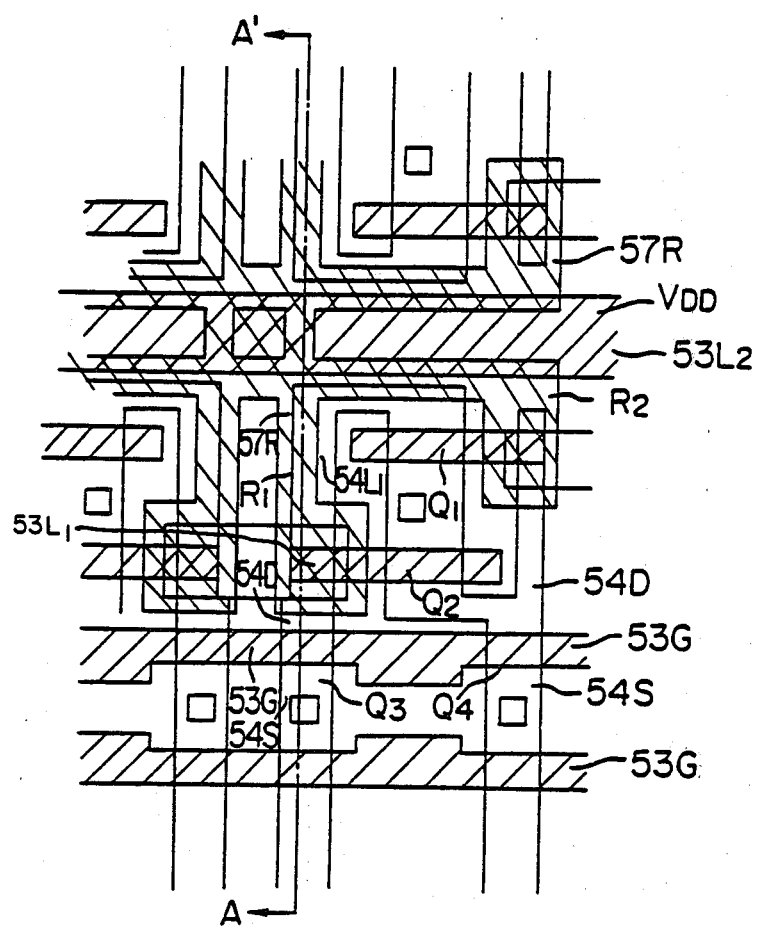

FIG. 9 shows a schematic plan view of the major portion of a static random access memory device in accordance with an embodiment of this invention. As described earlier, FIGS. 5 through 8 are cross-sectional views taken along the line A—A' shown in this figure.

It has become clear that in accordance with this invention, no limitation is imposed for the location of resistor elements fabricated with the second polycrystal semiconductor layer. In other words, resistor elements can be fabricated with the second polycrystal semiconductor layer at arbitrary places. This is effective to improve the circuit integration for a semiconductor device. Secondly, the ohmic contact between the substrate and resistor elements fabricated with the second polycrystal semiconductor layer is realized by the upward diffusion of impurities from the substrate and the first polycrystal silicon layer toward specific required regions. Therefore, the impurity concentration may be freely selected for the second polycrystal semiconductor layer. This is effective to select an optimum amount of resistivity for forming a resistor element having a desired resistance. Thirdly, it is noted that the method in accordance with this invention does not require a so-called non butting process.

I claim:

1. A semiconductor device comprising:
   a semiconductor substrate having regions with a high impurity concentration selectively located therein,
   a first insulator layer formed on said substrate to selectively cover said regions of said substrate,
   a highly doped first polycrystalline semiconductor layer formed selectively on said first insulator layer,
   a second insulator layer selectively covering said first polycrystalline semiconductor layer, and
   a second polycrystalline semiconductor layer selectively covering said first and second insulator layers, and selectively contacting parts of the first polycrystalline semiconductor layer and of said substrate regions, at least one of said parts of the first polycrystalline semiconductor layer being located contiguously to at least one of said substrate regions,
   wherein said second polycrystalline semiconductor layer is more heavily doped where it is in contact with said substrate regions and said first polycrystalline semiconductor layer, due to upward diffusion of impurites from said substrate regions and said first polycrystalline semiconductor layer, and
   wherein said first polycrystalline semiconductor layer comprises electrodes and wirings, and said second polycrystalline semiconductor layer comprises resistor elements overlying at least in part said substrate regions.

2. The semiconductor device of claim 1, wherein,
   said first insulator layer comprises a thick field insulator layer and a thin gate insulator layer, and
   each said part of said first polycrystalline semiconductor layer contacted by said second polycrystalline semiconductor layer is located at least in part on said thin gate insulator layer, and said resistor elements lie at least in part on said thin gate insulator.

3. The device of claim 2, comprising an array of memory cells, each said cell comprising two of said resistor elements and four transistors, each said transistors being formed of said substrate regions with said first polycrystalline semiconductor layer comprising the gate thereof, and the elements of each said cell being connected in a predetermined configuration with two bit lines and a word line.

4. The device of claim 3, each said cell comprising
   said substrate regions being arranged to form an S-shaped pattern,
   a first of said resistor elements lying along a respective one of the top or bottom of said S-shaped pattern, and
   the second of said two resistor elements lying along a respective one of the two other sides of said S-shaped pattern, perpendicularly to said first resistor element.

5. The device of claim 4, each said cell comprising
   said second polycrystalline semiconductor layer contacting two of said parts of said first polycrystalline semiconductor layer contiguously to two respective ones of said substrate regions, one at each of the two ends of said S-shaped pattern.

6. The device of claim 4, each said cell comprising
   said substrate regions forming an extension from each of the bottom and top of said S-shaped pattern, and
   said first polycrystalline semiconductor layer including a portion crossing both of said extensions.

7. The device of claim 6, both of said resistor elements overlying at least in part the same one of said substrate regions.

* * * * *

UNITED STATES PATENT AND TRADEMARK OFFICE
CERTIFICATE OF CORRECTION

PATENT NO. : 4,399,451

DATED : August 16, 1983

INVENTOR(S) : Shirai

It is certified that error appears in the above-identified patent and that said Letters Patent is hereby corrected as shown below:

Front page, [73] Assignee, "Kanagawa" should be --Kawasaki--;

Front page, insert:
--[30] Foreign Application Priority Data
Dec. 30, 1979 [JP] Japan .... 54-173201--;

Front page, [56] References Cited:
"Harada" should be --Harada et al.--;
"Raymond" should be --Raymond, Jr. et al.--;
"Tubbs" should be --Tubbs et al.--.

Col. 1, line 25, after "was" insert --directed to--;

Col. 1, line 26, "registor" should be --resistor--;

Col. 1, line 43, delete --numerals--;

Col. 1, line 44, delete and substitute therefore --oxide layer 20--;

Col. 1, line 46, after "layer" insert --21--.

Col. 2, line 48, after "(b)" insert --to--.

Col. 3, line 21, "avairable" should be --available--;

Col. 3, line 56, "100" should be --(100)--.

Col. 4, line 18, "53L," should be --$53L_1$--;

Col. 4, line 26, "54L," should be --$54L_1$--.

UNITED STATES PATENT AND TRADEMARK OFFICE
CERTIFICATE OF CORRECTION

PATENT NO. : 4,399,451
DATED : August 16, 1983
INVENTOR(S) : Shirai

It is certified that error appears in the above-identified patent and that said Letters Patent is hereby corrected as shown below:

Col. 5, line 45, "non butting" should be --non-butting--.

Col. 6, line 17, after "wherein" delete ",";

Col. 6, line 29, (in line 3 of claim 3) "transistors being" should be --transistor being--.

Signed and Sealed this

Sixteenth Day of October 1984

[SEAL]

Attest:

Attesting Officer

GERALD J. MOSSINGHOFF

Commissioner of Patents and Trademarks